United States Patent
Arai (10) Patent No.: US 11,417,780 B2
(45) Date of Patent: Aug. 16, 2022

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Masatoshi Arai, Hakusan (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/802,657

(22) Filed: Feb. 27, 2020

(65) Prior Publication Data
US 2021/0057589 A1 Feb. 25, 2021

(30) Foreign Application Priority Data
Aug. 20, 2019 (JP) .............................. JP2019-150475

(51) Int. Cl.
*H01L 29/47* (2006.01)
*H01L 29/872* (2006.01)
(52) U.S. Cl.
CPC .......... *H01L 29/8725* (2013.01); *H01L 29/47* (2013.01)
(58) Field of Classification Search
CPC combination set(s) only.
See application file for complete search history.

(56) References Cited

U.S. PATENT DOCUMENTS

| | | | | |
|---|---|---|---|---|
| 5,937,280 A | * | 8/1999 | Wen | H01L 27/1021 438/130 |
| 2006/0065926 A1 | * | 3/2006 | Kubo | H01L 29/7813 257/330 |
| 2008/0048254 A1 | * | 2/2008 | Saka | H01L 27/0207 257/330 |
| 2010/0096692 A1 | * | 4/2010 | Saito | H01L 29/7813 257/330 |
| 2013/0248924 A1 | * | 9/2013 | Matsudai | H01L 29/0834 257/139 |
| 2016/0268420 A1 | * | 9/2016 | Arai | H01L 29/66734 |
| 2019/0140086 A1 | * | 5/2019 | Chikamatsu | H01L 29/778 |

FOREIGN PATENT DOCUMENTS

| | | |
|---|---|---|
| JP | 09-082988 A | 3/1997 |
| JP | 3117506 B2 | 12/2000 |
| JP | 5566020 B2 | 8/2014 |

\* cited by examiner

*Primary Examiner* — Moin M Rahman
(74) *Attorney, Agent, or Firm* — Oblon, McClelland, Maier & Neustadt, L.L.P.

(57) ABSTRACT

A semiconductor device includes a semiconductor part of a first conductivity type, a trench being provided in the semiconductor part at a front surface side; a first electrode provided on a back surface of the semiconductor part; a second electrode provided on the front surface of the semiconductor part; a first semiconductor layer of a second conductivity type provided inside the trench; and a insulating film electrically isolating the first semiconductor layer from the semiconductor part. The second electrode is electrically connected to the semiconductor part and the first semiconductor layer. The second electrode contacts the semiconductor part with a rectification property.

12 Claims, 9 Drawing Sheets

SEMICONDUCTOR DEVICE

CROSS-REFERENCE TO RELATED APPLICATIONS

This application is based upon and claims the benefit of priority from Japanese Patent Application No. 2019-150475, filed on Aug. 20, 2019; the entire contents of which are incorporated herein by reference.

FIELD

Embodiments relate to a semiconductor device.

BACKGROUND

A power semiconductor device is desired to have characteristics of high breakdown voltage and low leak current when being turned off in the switching operation.

DETAILED DESCRIPTION

According to one embodiment, a semiconductor device includes a semiconductor part of a first conductivity type, a trench being provided in the semiconductor part at a front surface side; a first electrode provided on a back surface of the semiconductor part; a second electrode provided on the front surface of the semiconductor part; a first semiconductor layer of a second conductivity type provided inside the trench; and a insulating film electrically isolating the first semiconductor layer from the semiconductor part. The second electrode is electrically connected to the semiconductor part and the first semiconductor layer. The second electrode contacts the semiconductor part with a rectification property.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
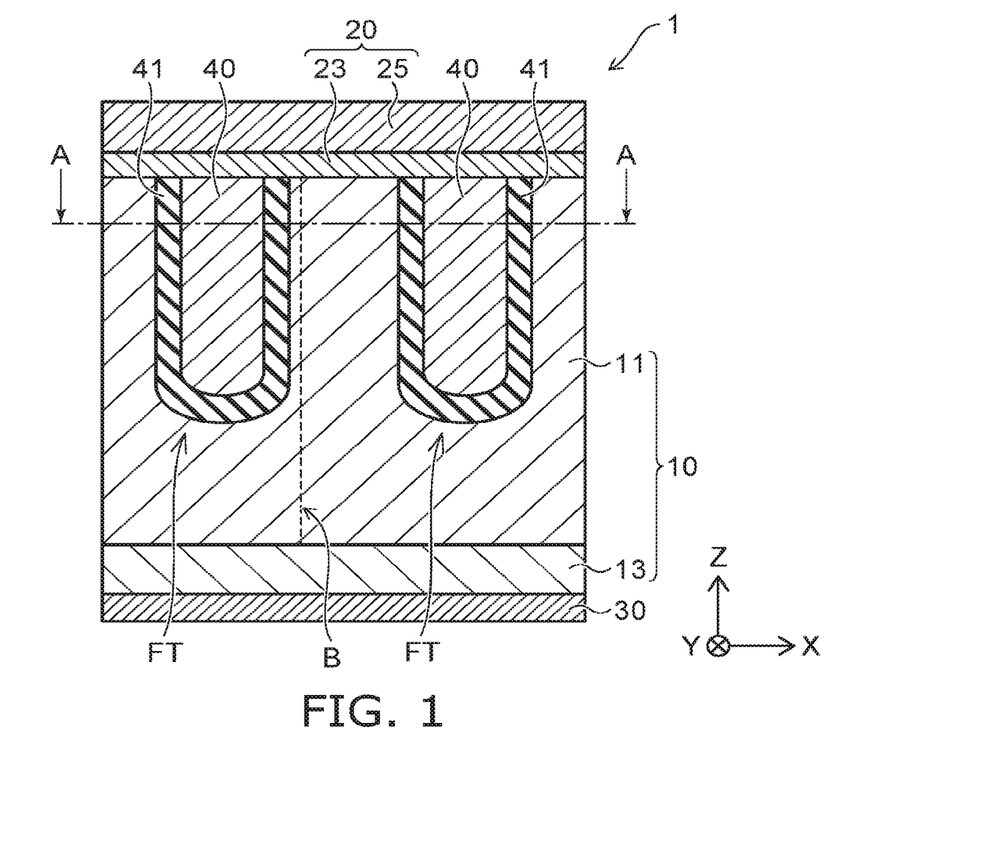
FIG. 1 is a schematic cross-sectional view showing a semiconductor device according to an embodiment.

FIG. 1 is a schematic cross-sectional view showing a semiconductor device 1 according to an embodiment. The semiconductor device 1 is, for example, a Schottky Barrier Diode (SBD).

The semiconductor device 1 includes a semiconductor part 10 of an n-type conductivity, an anode electrode 20, a cathode electrode 30, and a p-type semiconductor layer 40. The anode electrode 20 is provided on a front surface of the semiconductor part 10 and the cathode electrode 30 is provided on a back surface of the semiconductor part 10. The semiconductor part 10 is, for example, silicon. The p-type semiconductor layer 40 is, for example, a p-type polysilicon layer.

The anode electrode 20 includes, for example, a contact layer 23 and a bonding layer 25. The contact layer 23 is directly connected to the semiconductor part 10 via a contact surface providing a rectification property. The contact layer 23 is connected to the semiconductor part 10 with so called the Schottky Junction. The contact layer 23 is a metal layer including, for example, titanium or cobalt. The bonding layer 25 is a metal layer including, for example, aluminum.

The p-type semiconductor layer 40 is disposed inside a trench FT provided at the front surface side of the semiconductor part 10. The p-type semiconductor layer 40 is electrically isolated from the semiconductor part 10 by an insulating layer 41. The insulating layer 41 includes, for example, silicon oxide. The p-type semiconductor layer 40 functions, for example, as a field plate.

The p-type semiconductor layer 40 is electrically connected to the anode electrode 20. That is, the p-type semiconductor layer 40 is biased at the same potential as a potential of the anode electrode 20. In this example, the p-type semiconductor layer 40 is directly connected to the contact layer 23.

The semiconductor part 10 includes, for example, an n-type region 11 and an $n^+$-type region 13. The contact layer 23 is in contact with the n-type region 11. The $n^+$-type region 13 is provided between the n-type region 11 and the cathode electrode 30. The $n^+$-type region 13 includes an n-type impurity with a concentration higher than a concentration of an n-type impurity in the n-type region 11. For example, the cathode electrode 30 is in contact with the $n^+$-type region 13 so as to be electrically connected thereto.

Figure 2A:
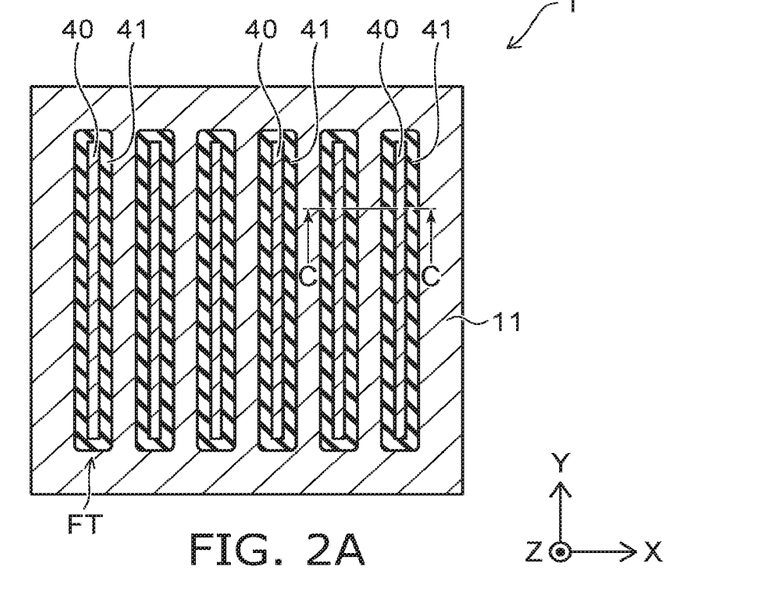
FIGS. 2A and 2B are schematic views showing other cross sections of the semiconductor device according to the embodiment.
Figure 2B:
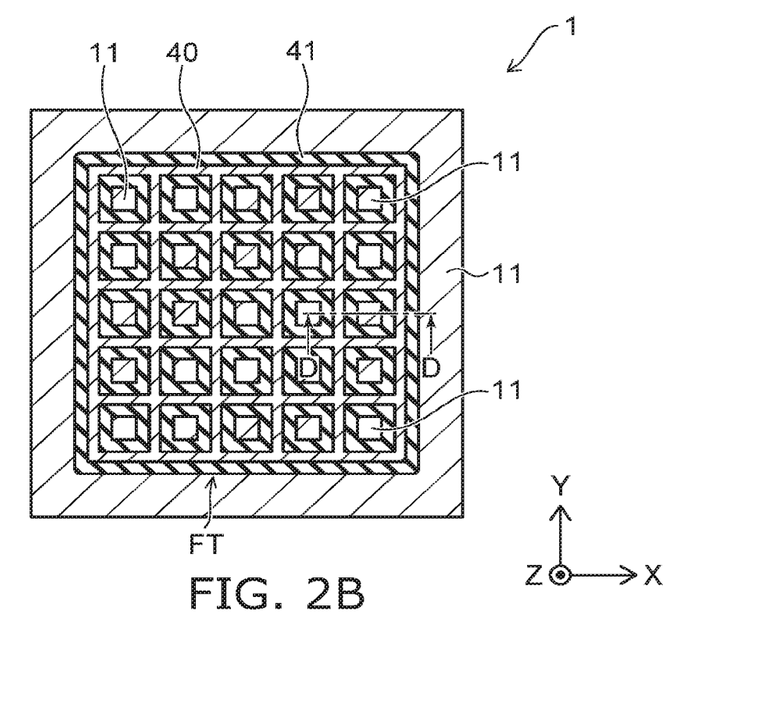

FIGS. 2A and 2B are schematic views showing other cross-sections of the semiconductor device 1 according to the embodiment. FIGS. 2A and 2B are schematic views illustrating the cross-section along A-A line shown in FIG. 1. FIG. 1 is the schematic view illustrating the cross section along C-C line shown in FIG. 2A, or the cross section along D-D' line shown in FIG. 2B.

As shown in FIG. 2A, multiple trenches FT are provided, which extend in the Y-direction. The p-type semiconductor layer 40 is disposed in each of the multiple trenches FT. In this example, a plurality of p-type semiconductor layers 40 are provided.

As shown in FIG. 2B, a trench FT are provided, which is provided with a lattice configuration. The p-type semiconductor layer 40 is provided in the lattice configuration inside the trench FT. In this example, the p-type semiconductor layer 40 is provided with a single body.

Figure 3A:
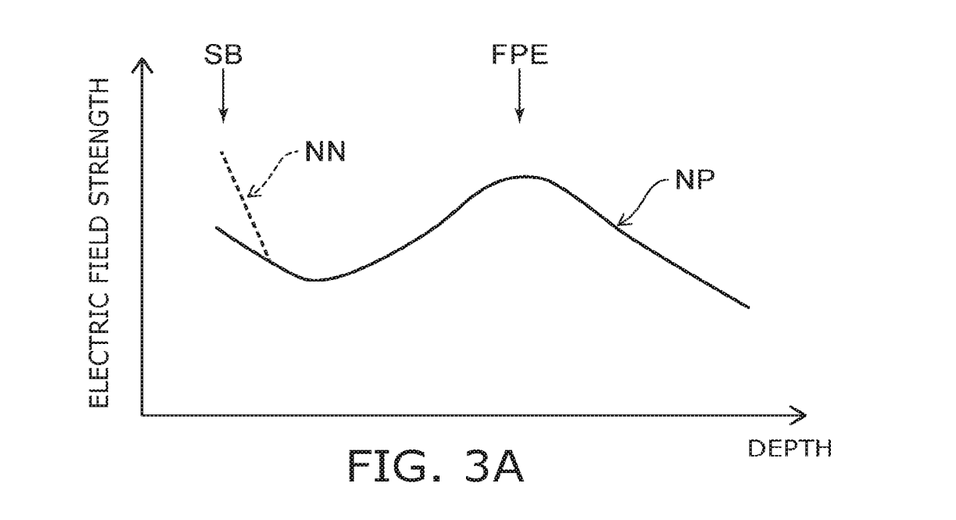
FIGS. 3A and 3B are schematic views showing characteristics of the semiconductor device according to the embodiment.
Figure 3B:
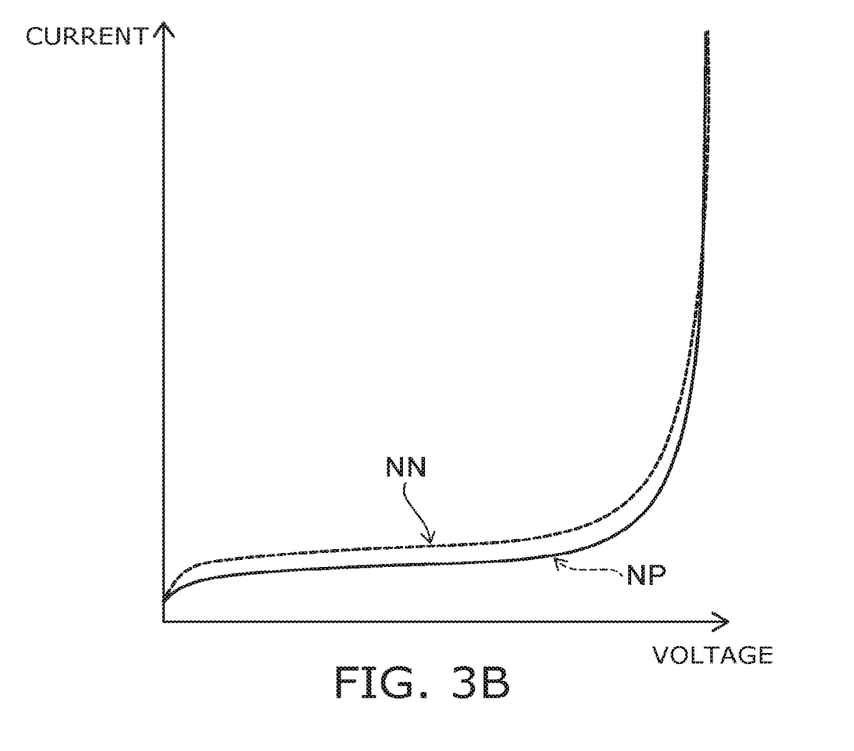

FIGS. 3A and 3B are schematic cross-sectional views showing characteristics of the semiconductor device 1 according to the embodiment. FIG. 3A is a schematic diagram showing the electric field strength distribution in the n-type region 11 when the semiconductor device 1 is turned off. In FIG. 3A, the electric field strength distribution along the broken line B shown in FIG. 1 is illustrated. FIG. 3B is a schematic diagram showing current-voltage characteristics when the semiconductor device 1 is reverse biased.

The symbols "NP" shown in the figures indicate the characteristics of the semiconductor device 1. The symbols "NN" indicate the characteristics of a semiconductor device according to a comparative example. In the semiconductor device according to the comparative example, an n-type semiconductor layer is disposed inside the trench FT in place of the p-type semiconductor layer 40.

Further, the symbol "SB" shown in FIG. 3A indicates the position of the interface between the n-type region 11 and the anode electrode 20 (that is, the Schottky Junction position). The symbol "FPE" indicates the position of the end of the p-type semiconductor layer 40 close to the cathode electrode 30.

As shown in FIG. 3A, in the semiconductor device 1, the electric field strength becomes maximum at the end FPE of the p-type semiconductor layer 40. Thus, it is possible to facilitate an extension of the depletion region in a portion of the n-type region 11 that is positioned between the adjacent trenches FT. That is, even if the concentration of the n-type impurity in the n-type region 11 is increased, it is possible at the turned-off to make the n-type 11 region be depleted and to maintain the high breakdown voltage. In other words, by providing the semiconductor part 10 with the trench structure in which the p-type semiconductor layer 40 is disposed, it is possible to increase the impurity concentration of the n-type region 11 without the breakdown voltage lowered at the turned-off. Thereby, the on-resistance is reduced in the semiconductor device 1.

Furthermore, in the embodiment, the depletion region of the n-type region 11 is facilitated to extend in the vicinity of the Schottky junction by the potential difference between the n-type region 11 and the p-type semiconductor layer 40. That is, the electric field strength at the Schottky Junction position SB can be reduced as compared with the comparative example in which the n-type semiconductor layer is disposed in the trench FT (see the portion indicated by NN in FIG. 3A).

As shown in FIG. 3B, the reverse current (i.e., the leakage current) is reduced in the semiconductor device 1 as compared with the semiconductor device according to the comparative example. Thus, the power consumption is reduced in the semiconductor device 1.

Figure 4A:
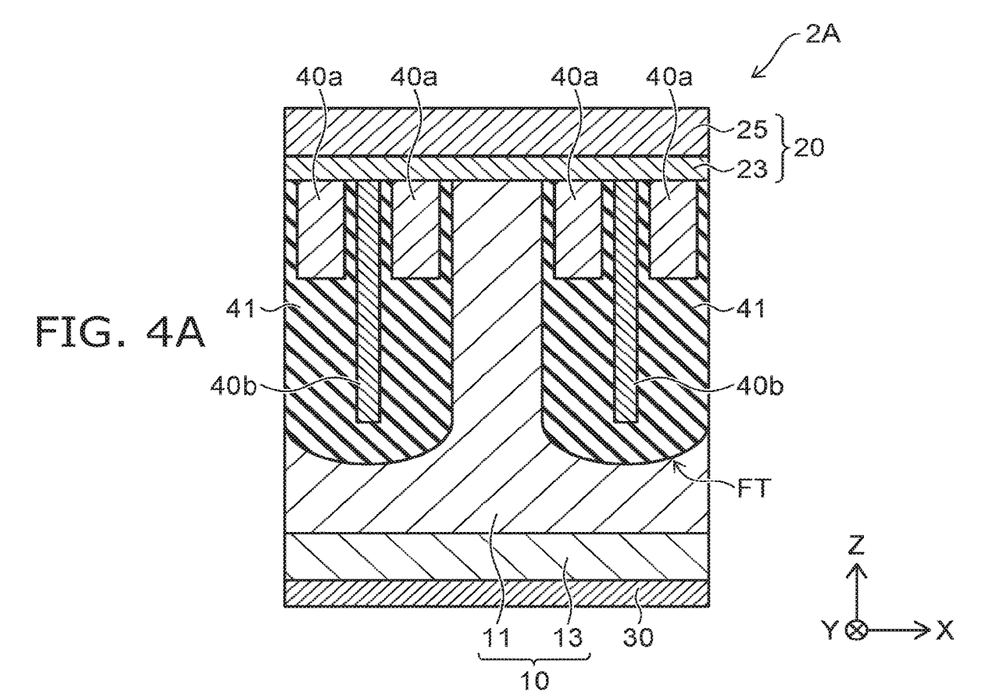
FIGS. 4A and 4B are schematic cross-sectional views showing semiconductor devices according to a first modification of the embodiment.
Figure 4B:
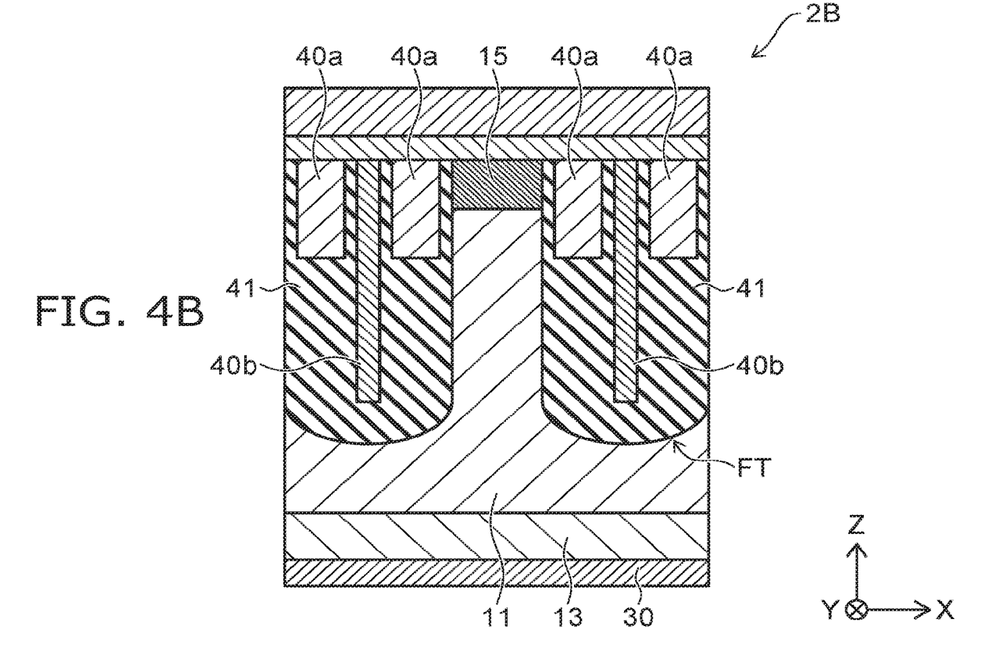

FIGS. 4A and 4B are schematic cross-sectional views showing semiconductor devices 2A and 2B according to a first modification of the embodiment.

The semiconductor devices 2A and 2B each include a p-type semiconductor layer 40a and an n-type semiconductor layer 40b. The p-type semiconductor layer 40a and the n-type semiconductor layer 40b are provided in the trench FT. The p-type semiconductor layer 40a and the n-type semiconductor layer 40b are electrically isolated from the semiconductor part 10 by the insulating layer 41.

As shown in FIG. 4A, the n-type region 11, the p-type semiconductor layer 40a and the n-type semiconductor layer 40b are arranged in the X-direction. The p-type semiconductor layer 40a is provided between the n-type region 11 and the n-type semiconductor layer 40b. Moreover, the p-type semiconductor layer 40a and another p-type semiconductor layer 40a are provided in the trench FT; and the n-type semiconductor layer 40b includes a portion positioned between the p-type semiconductor layer 40a and the other p-type semiconductor layer 40a.

The p-type semiconductor layer 40a has the upper end on the side of the anode electrode 20 and the lower end on the side of the cathode electrode 30. The n-type semiconductor layer 40b has the upper end on the side of the anode electrode 20 and the lower end on the side of the cathode electrode 30. The lower end of the n-type semiconductor layer 40b is provided at a position closer to the bottom of the trench FT than a position of the lower end of the p-type semiconductor layer 40a. For example, the upper end of the p-type semiconductor layer 40a and the upper end of the n-type semiconductor layer 40b are directly connected to the contact layer 23 of the anode electrode 20.

The n-type semiconductor layer 40b has the end closer to the bottom of the trench FT than the end of the p-type semiconductor layer 40a. Thereby, it is possible at the turned-off to enhance the breakdown voltage by facilitating the extension of the depletion region in the n-type region 11 between the adjacent trenches FT. Furthermore, it is possible to reduce the electric field at the interface between the n-type region 11 and the contact layer 23 (i.e., the Schottky Junction position) by providing the p-type semiconductor layer 40a in the upper portion of the trench FT and thus, to reduce the leakage current under the reverse bias.

In the semiconductor device 2B shown in FIG. 4B, an $n^-$-type region 15 is further provided between the n-type region 11 and the anode electrode 20. The $n^-$-type region 15 includes an n-type impurity with a concentration lower than a concentration of the n-type impurity in the n-type region 11. The contact layer 23 of the anode electrode 20 is in contact with the $n^-$-type region 15. Thereby, the extension of the depletion region near the interface between the $n^-$-type region 15 and the contact layer 23 can be further facilitated under the reverse bias. Thus, the electric field strength is reduced at the interface between the $n^-$-type region 15 and the contact layer 23; and it is possible to suppress the leakage current.

Figure 5A:
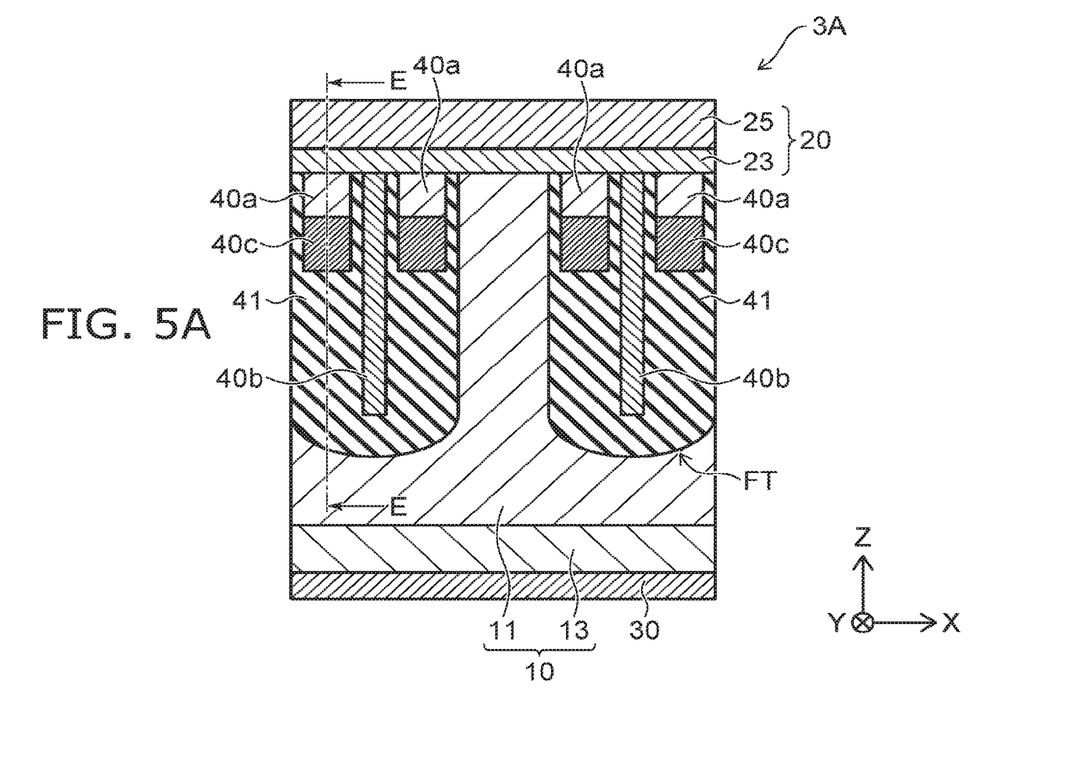
FIGS. 5A to 5C are schematic cross-sectional views showing semiconductor devices according to a second modification of the embodiment.
Figure 5B:
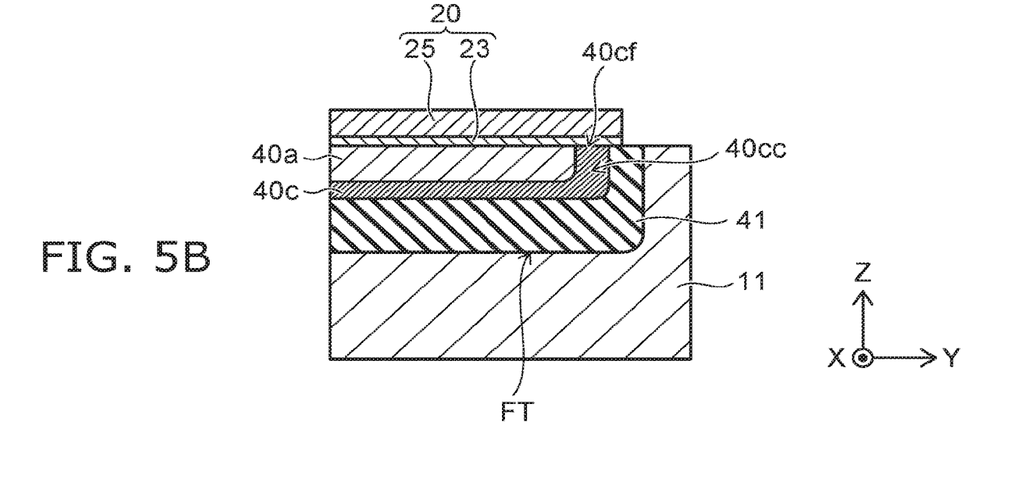
Figure 5C:
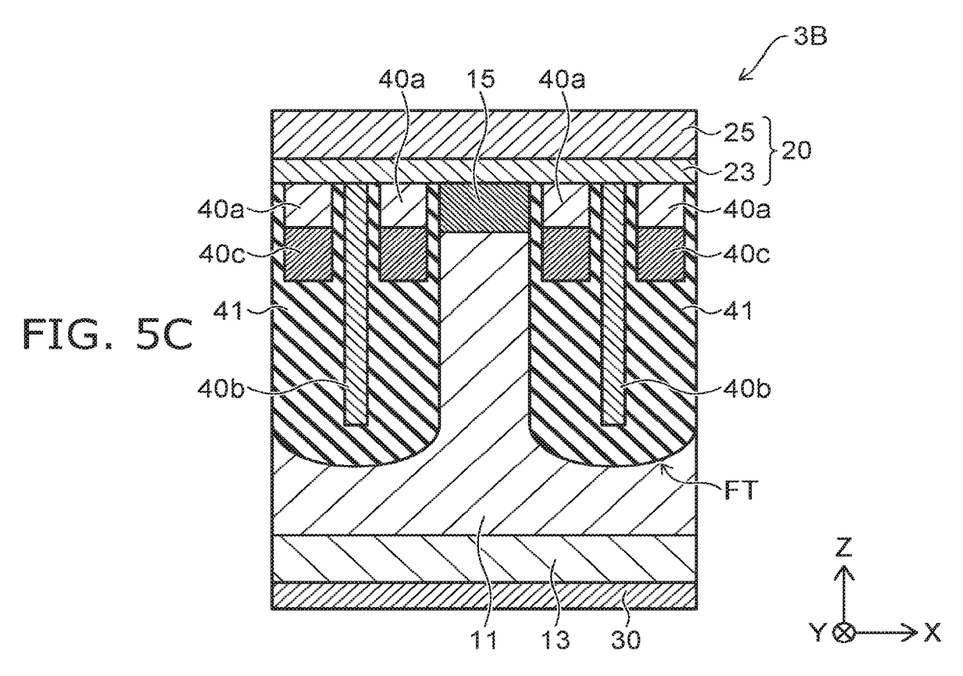

FIGS. 5A to 5C are schematic cross-sectional views showing semiconductor devices 3A and 3B according to a second modification of the embodiment. FIG. 5B is a cross-sectional view of the semiconductor device 3A taken along E-E line in FIG. 5A.

The semiconductor devices 3A and 3B each include a p-type semiconductor layer 40a, an n-type semiconductor layer 40b, and an n-type semiconductor layer 40c. The p-type semiconductor layer 40a, the n-type semiconductor layer 40b and the n-type semiconductor layer 40c are provided in the trench FT. The p-type semiconductor layer 40a, the n-type semiconductor layer 40b and the n-type semiconductor layer 40c are electrically isolated from the semiconductor part 10 by the insulating layer 41.

As shown in FIG. 5A, the n-type region 11, the p-type semiconductor layer 40a and the n-type semiconductor layer 40b are arranged in the X-direction. The p-type semiconductor layer 40a is provided between the n-type region 11 and the n-type semiconductor layer 40b. The n-type region 11, the n-type semiconductor layer 40c and the n-type semiconductor layer 40b are arranged in the X-direction.

The n-type semiconductor layer 40c is provided between the n-type region 11 and the n-type semiconductor layer 40b in the X-direction. Further, the p-type semiconductor layer 40a is provided between the anode electrode 20 and the n-type semiconductor layer 40c.

Other p-type semiconductor layer 40a and other n-type semiconductor layer 40c are also provided in the trench FT. The n-type semiconductor layer 40b includes a portion provided between the p-type semiconductor layer 40a and the other p-type semiconductor layer 40a and between the n-type semiconductor layers 40c and the other n-type semiconductor layer 40c.

The p-type semiconductor layer 40a has the upper end on the side of the anode electrode 20 and the lower end on the side of the n-type semiconductor layer 40c. The n-type semiconductor layer 40c has the upper end on the side of the p-type semiconductor layer 40a and the lower end on the side of the cathode electrode 30. The lower end of the p-type semiconductor layer 40a is directly in contact with the upper end of the n-type semiconductor layer 40c.

The n-type semiconductor layer 40b has the upper end on the side of the anode electrode 20 and the lower end on the side of the cathode electrode 30. For example, the upper end of the p-type semiconductor layer 40a and the upper end of the n-type semiconductor layer 40b are directly connected to the contact layer 23 of the anode electrode 20.

As shown in FIG. 5B, the n-type semiconductor layer 40c, for example, is electrically connected to the anode electrode 20 shown so that the n-type semiconductor layer 40c is biased at the same potential as a potential of the anode electrode 20.

The n-type semiconductor layer 40c has a connection portion 40cc at the end in the Y-direction. The connection portion 40cc extends upward along the end of the p-type semiconductor 40a. The connection portion 40cc has an upper surface 40cf which is positioned at the same level as the level of the upper surface of the p-type semiconductor layer 40a. The anode electrode 20 is in contact with the n-type semiconductor layer 40c at the upper surface 40cf.

As shown in FIG. 5A, the lower end of the n-type semiconductor layer 40b is provided at a position closer to the bottom of the trench FT than a position of the lower end of the n-type semiconductor layer 40c. That is, the n-type semiconductor layer 40b has a portion extending downward from a level of the lower end of the n-type semiconductor layer 40c in the Z-direction. Thereby, the depletion region in the n-type region 11 is facilitated to extend between the adjacent trenches FT and enhances the breakdown voltage at the turned-off.

Furthermore, the electric field at the interface between the n-type region 11 and the contact layer 23 is reduced, and thus, the leakage current is reduced under the reverse bias by providing the p-type semiconductor layer 40a in the upper portion of the trench FT.

In the semiconductor device 3B shown in FIG. 5C, an n$^-$-type region 15 is further provided between the n-type region 11 and the anode electrode 20. The n$^-$-type region 15 includes an n-type impurity with a concentration lower than a concentration of the n-type impurity in the n-type region 11. The contact layer 23 of the anode electrode 20 is in contact with the n$^-$-type region 15. Thus, the depletion region is facilitated to extend under the reverse bias near the interface between the n$^-$-region 15 and the contact layer 23. As a result, the electric field strength is further reduced at the interface between the n$^-$-type region 15 and the contact layer 23, and suppresses the leakage current.

Figure 6A:
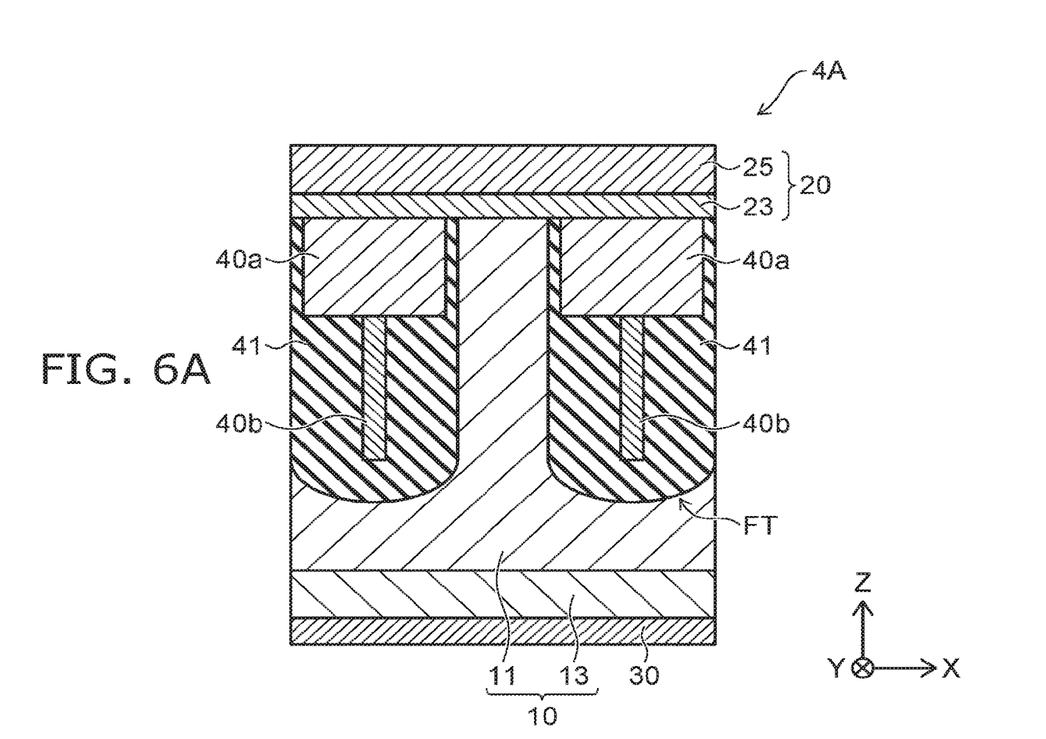
FIGS. 6A and 6B are schematic cross-sectional views showing semiconductor devices according to a third modification of the embodiment.
Figure 6B:
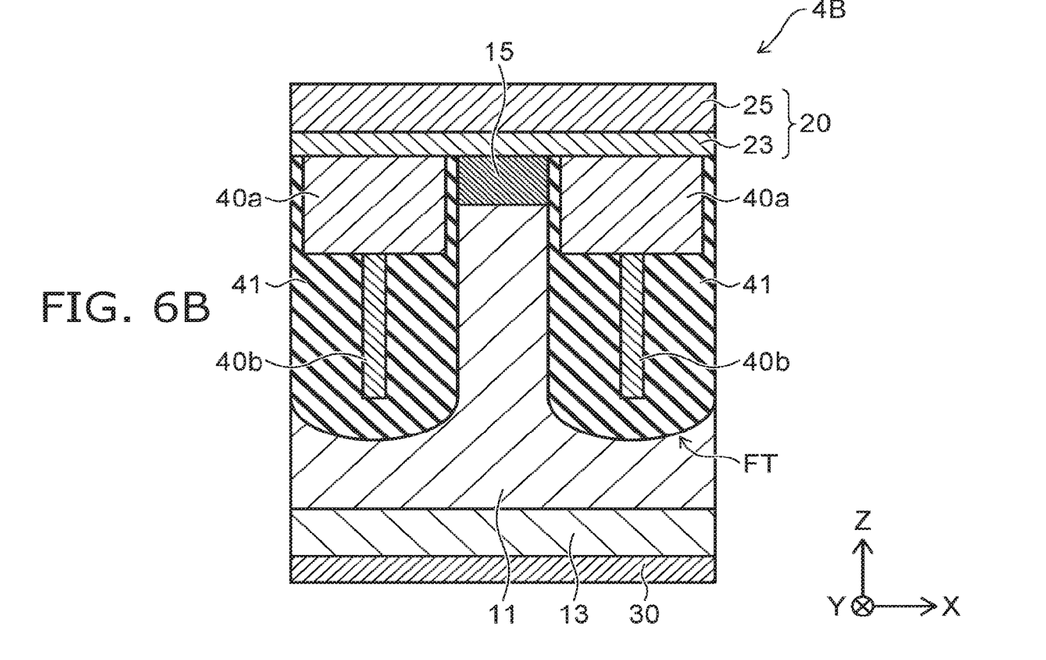

FIGS. 6A and 6B are schematic cross-sectional views showing semiconductor devices 4A and 4B according to a third modification of the embodiment.

The semiconductor devices 4A and 4B each include the p-type semiconductor layer 40a and the n-type semiconductor layer 40b. The p-type semiconductor layer 40a and the n-type semiconductor layer 40b are provided in the trench FT. The p-type semiconductor layer 40a and the n-type semiconductor layer 40b are electrically isolated from the semiconductor part 10 by the insulating layer 41.

As shown in FIG. 6A, the p-type semiconductor layer 40a is provided between the anode electrode 20 and the n-type semiconductor layer 40b. The n-type semiconductor layer 40b has a width in the X-direction, and the width of the n-type semiconductor layer 40b is narrower than a width of the p-type semiconductor layer 40a in the X-direction.

The p-type semiconductor layer 40a has the upper end on the side of the anode electrode 20 and the lower end on the side of the n-type semiconductor layer 40b. The n-type semiconductor layer 40b has the upper end on the side of the p-type semiconductor layer 40a and the lower end on the side of the cathode electrode 30. The upper end of the n-type semiconductor layer 40b is directly in contact with the lower end of the p-type semiconductor layer 40a.

For example, the upper end of the p-type semiconductor layer 40a is directly connected to the contact layer 23 of the anode electrode 20. Further, the n-type semiconductor layer 40b may be electrically connected to the anode electrode 20 in a portion not shown so that the n-type semiconductor layer 40b is biased at the same potential as a potential of the anode electrode 20 (see FIG. 5B).

In this example, the depletion region in the n-type region 11 is facilitated to extend between adjacent trenches FT, and the breakdown voltage at the turn-off is enhanced by providing the n-type semiconductor layer 40b under the p-type semiconductor layer 40a. Furthermore, the electric field is reduced at the interface between the n-type region 11 and the contact layer 23, and the leakage current under the reverse bias is reduced by disposing the p-type semiconductor layer 40a on the upper portion of the trench FT.

In the semiconductor device 4B shown in FIG. 6B, the n$^-$-type region 15 is further provided between the n-type region 11 and the anode electrode 20. The contact layer 23 of the anode electrode 20 is in contact with the n$^-$-type region 15. Thereby, the depletion region is facilitated to extend near the interface between the n$^-$-type region 15 and the contact layer 23 under the reverse bias, and the electric field strength at the interface between the n$^-$-type region 15 and the contact layer 23 is reduced. Thus, the leakage current is suppressed under the reverse bias.

Figure 7A:
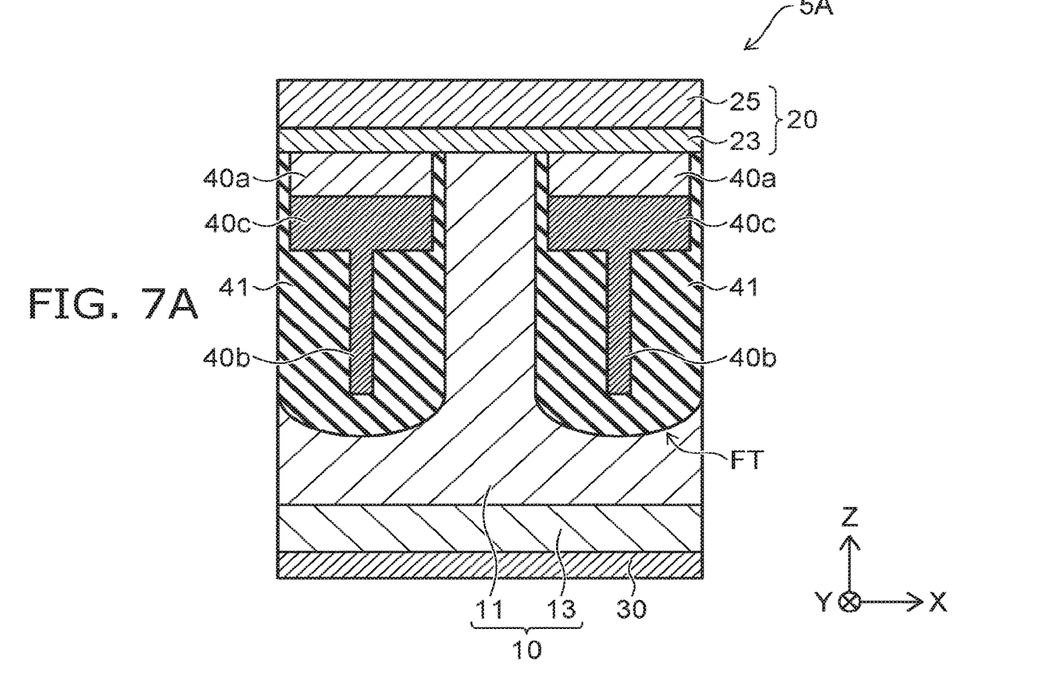
FIGS. 7A and 7B are schematic cross-sectional views showing semiconductor devices according to a fourth modification of the embodiment.
Figure 7B:
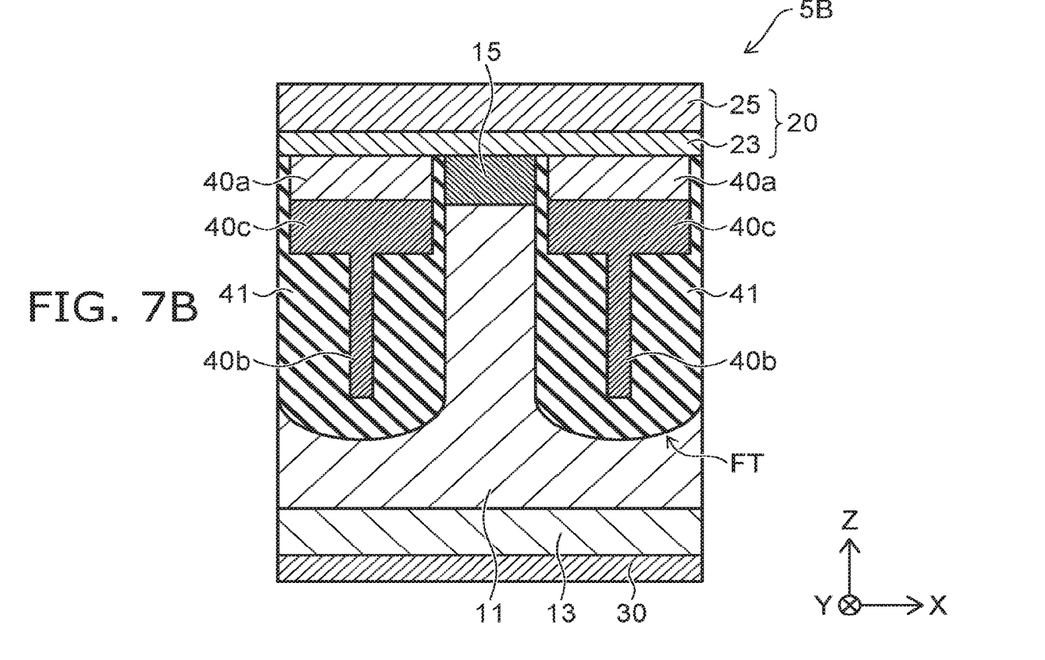

FIGS. 7A and 7B are schematic cross-sectional views showing semiconductor devices 5A and 5B according to a fourth modification of the embodiment.

The semiconductor devices 5A and 5B each include the p-type semiconductor layer 40a, the n-type semiconductor layer 40b, and the n-type semiconductor layer 40c. The p-type semiconductor layer 40a, the n-type semiconductor layer 40b, and the n-type semiconductor layer 40c are provided in the trench FT. The p-type semiconductor layer 40a, the n-type semiconductor layer 40b, and the n-type semiconductor layer 40c are electrically isolated from the semiconductor part 10 by the insulating layer 41.

As shown in FIG. 7A, the p-type semiconductor layer 40a and the n-type semiconductor layer 40c are provided between the anode electrode 20 and the n-type semiconductor layer 40b. The p-type semiconductor layer 40a is provided between the anode electrode 20 and the n-type semiconductor layer 40c. The n-type semiconductor layer 40c is provided between the p-type semiconductor layer 40a and the n-type semiconductor layer 40b. The n-type semiconductor layer 40b has a width in the X-direction, and the width of the n-type semiconductor layer 40b is narrower than the width of the p-type semiconductor layer 40a in the X-direction and the width of the n-type semiconductor layer 40c in the X-direction.

The p-type semiconductor layer 40a has the upper end on the side of the anode electrode 20 and the lower end on the side of the n-type semiconductor layer 40c. The n-type semiconductor layer 40b has the upper end on the side of the n-type semiconductor layer 40c and the lower end on the side of the cathode electrode 30. The upper end of the n-type semiconductor layer 40c is directly in contact with the lower end of the p-type semiconductor layer 40a. The lower end of the n-type semiconductor layer 40c is in contact with the upper end of the n-type semiconductor layer 40b.

For example, the upper end of the p-type semiconductor layer 40a is directly connected to the contact layer 23 of the anode electrode 20. Further, the n-type semiconductor layer 40b or the n-type semiconductor layer 40c may be electrically connected to the anode electrode 20 in a portion not shown so that the n-type semiconductor layers 40b and 40c are biased at the same potential as a potential of the anode electrode 20 (see FIG. 5B).

In this example, the depletion region in the n-type region 11 is facilitated to extend between adjacent trenches FT, and the breakdown voltage at the turn-off is enhanced by providing the n-type semiconductor layer 40b under the n-type semiconductor layer 40c. Furthermore, the electric field is reduced at the interface between the n-type region 11 and the contact layer 23, and the leakage current under the reverse bias is reduced by providing the p-type semiconductor layer 40a in the upper portion of the trench FT.

In the semiconductor device 5B shown in FIG. 7B, the n$^-$-type region 15 is further provided between the n-type region 11 and the anode electrode 20. The n$^-$-type region 15 is provided between the adjacent p-type semiconductor layers 40a. The contact layer 23 of the anode electrode 20 is in contact with the n$^-$-type region 15. Thereby, the depletion region is facilitated to extend near the interface between the n$^-$-type region 15 and the contact layer 23 under the reverse bias, and the electric field strength at the interface between the n$^-$-type region 15 and the contact layer 23 is reduced. Thus, the leakage current is suppressed under the reverse bias.

Figure 8A:
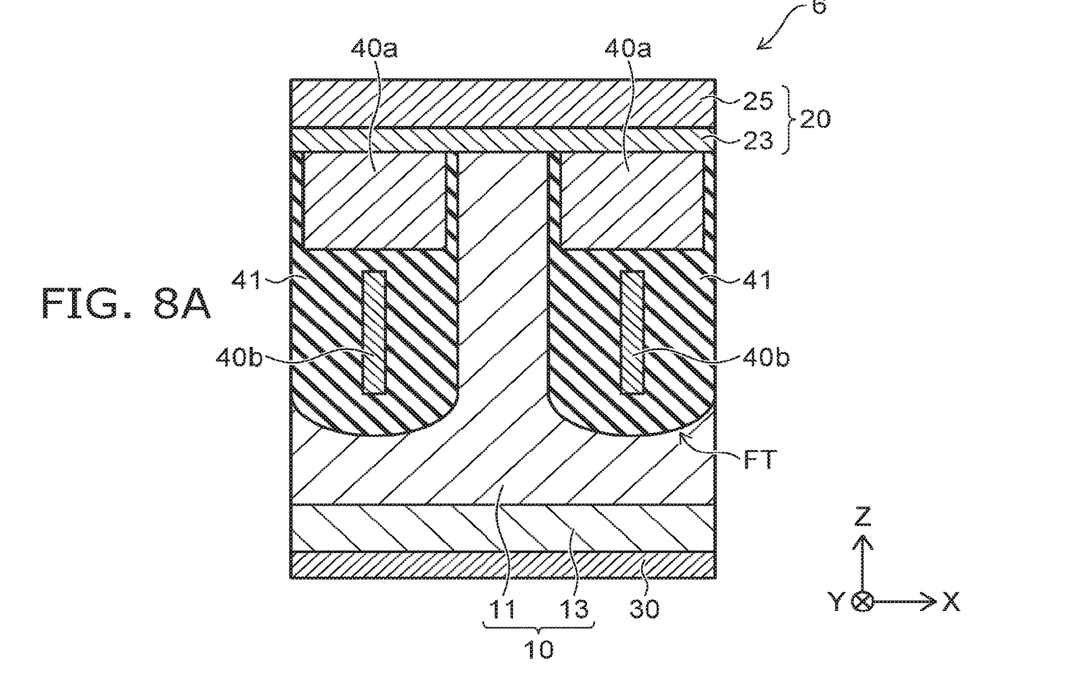
FIGS. 8A and 8B are schematic cross-sectional views showing semiconductor devices according to a fifth modification of the embodiment.
Figure 8B:
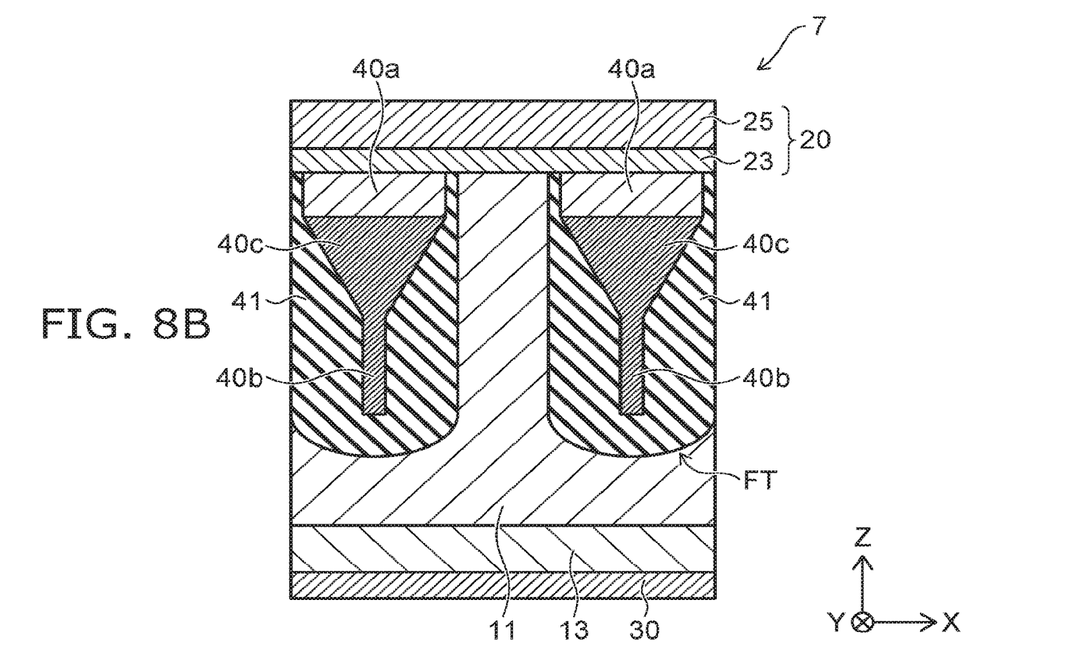

FIGS. 8A and 8B are schematic cross-sectional views showing semiconductor devices 6 and 7 according to a fifth modification of the embodiment.

The semiconductor device 6 shown in FIG. 8A includes the p-type semiconductor layer 40a and the n-type semiconductor layer 40b. The p-type semiconductor layer 40a and the n-type semiconductor layer 40b are provided in the trench FT. The p-type semiconductor layer 40a and the n-type semiconductor layer 40b are electrically isolated from the semiconductor part 10 by the insulating layer 41.

As shown in FIG. 8A, the p-type semiconductor layer 40a is provided between the anode electrode 20 and the n-type semiconductor layer 40b. The n-type semiconductor layer 40b has a width in the X-direction, and the width of the n-type semiconductor layer 40b is narrower than the width of the p-type semiconductor layer 40a in the X-direction.

The p-type semiconductor layer 40a has the upper end on the side of the anode electrode 20 and the lower end on the side of the n-type semiconductor layer 40b. The n-type semiconductor layer 40b has the upper end on the side of the p-type semiconductor layer 40a and the lower end on the side of the cathode electrode 30. The n-type semiconductor layer 40b is provided at a position spaced from the p-type semiconductor layer 40a.

For example, the upper end of the p-type semiconductor layer 40a is directly connected to the contact layer 23 of the anode electrode 20. Further, the n-type semiconductor layer 40b is electrically connected to the anode electrode 20 in a portion not shown so that the n-type semiconductor layer 40b is biased at the same potential as a potential of the anode electrode 20 (see FIG. 5B).

In this example, the depletion region in the n-type region 11 is facilitated to extend between adjacent trenches FT, and the breakdown voltage at the turn-off is enhanced by providing the n-type semiconductor layer 40b under the n-type semiconductor layer 40a. Furthermore, the electric field is reduced at the interface between the n-type region 11 and the contact layer 23, and the leakage current under the reverse bias is reduced by providing the p-type semiconductor layer 40a in the upper portion of the trench FT. Moreover, the n$^-$-type region 15 may be provided between the n-type region 11 and the anode electrode 20.

The semiconductor device 7 shown in FIG. 8B includes the p-type semiconductor layer 40a, the n-type semiconductor layer 40b, and the n-type semiconductor layer 40c. The p-type semiconductor layer 40a, the n-type semiconductor layer 40b, and the n-type semiconductor layer 40c are provided in the trench FT. The p-type semiconductor layer 40a, the n-type semiconductor layer 40b, and the n-type semiconductor layer 40c are electrically isolated from the semiconductor part 10 by the insulating layer 41.

As shown in FIG. 8B, the p-type semiconductor layer 40a and the n-type semiconductor layer 40c are provided between the anode electrode 20 and the n-type semiconductor layer 40b. The p-type semiconductor layer 40a is provided between the anode electrode 20 and the n-type semiconductor layer 40c. The n-type semiconductor layer 40c is provided between the p-type semiconductor layer 40a and the n-type semiconductor layer 40b. The n-type semiconductor layer 40b has a width in the X-direction, and the width of the n-type semiconductor layer 40b is narrower than the width of the p-type semiconductor layer 40a in the X-direction.

The n-type semiconductor layer 40c has a width in the X-direction; and the width of the n-type semiconductor layer 40c is narrower than the width of the p-type semiconductor layer 40a in the X-direction and wider than the width of the n-type semiconductor layer 40b in the X-direction. The width of the n-type semiconductor layer 40c increases as being closer to the p-type semiconductor layer 40a, and decreases as being closer to the n-type semiconductor layer 40b.

The p-type semiconductor layer 40a has the upper end on the side of the anode electrode 20 and the lower end on the side of the n-type semiconductor layer 40c. The n-type semiconductor layer 40b has the upper end on the side of the n-type semiconductor layer 40c and the lower end on the side of the cathode electrode 30. The upper end of the n-type semiconductor layer 40c is directly in contact with the lower end of the p-type semiconductor layer 40a; and the lower end of the n-type semiconductor layer 40c is directly in contact with the upper end of the n-type semiconductor layer 40b.

For example, the upper end of the p-type semiconductor layer 40a is directly connected to the contact layer 23 of the anode electrode 20. Further, the n-type semiconductor layer 40b or the n-type semiconductor layer 40c may be electrically connected to the anode electrode 20 in a portion not shown so that the n-type semiconductor layers 40b and 40c is biased at the same potential as a potential of the anode electrode 20 (see FIG. 5B).

In this example, the depletion region in the n-type region 11 is facilitated to extend between adjacent trenches FT, and the breakdown voltage at the turn-off is enhanced by providing the n-type semiconductor layer 40b under the n-type semiconductor layer 40c. Furthermore, the electric field is reduced at the interface between the n-type region 11 and the contact layer 23, and the leakage current under the reverse bias is reduced by providing the p-type semiconductor layer 40a in the upper portion of the trench FT.

Although several examples have been described above, the embodiments are not limited thereto. In any example, the $n^-$-type region 15 may be provided between the n-type region 11 and the anode electrode 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a semiconductor part of a first conductivity type, a trench being provided in the semiconductor part at a front surface side;
   a first electrode provided on a back surface of the semiconductor part;
   a second electrode provided on the front surface of the semiconductor part;
   a first semiconductor layer of a second conductivity type provided inside the trench, the first semiconductor layer being electrically connected to the second electrode; and
   an insulating film isolating the first semiconductor layer from the semiconductor part,
   wherein the second electrode contacts the semiconductor part, and a Schottky Junction is provided at an interface between the second electrode and the semiconductor part.

2. The device according to claim 1, further comprising:
   a second semiconductor layer of a first conductivity provided in the trench, the second semiconductor layer including an end portion closer to a bottom of the trench than an end portion of the first semiconductor layer,
   the second semiconductor layer being electrically isolated from the semiconductor part by the insulating layer.

3. The device according to claim 2, wherein the first semiconductor layer is provided between the second semiconductor layer and the second electrode.

4. The device according to claim 3, wherein the second semiconductor layer is spaced from the first semiconductor layer.

5. The device according to claim 3, wherein the second semiconductor layer is directly connected to the first semiconductor layer.

6. The device according to claim 5, wherein the first semiconductor layer has a width in a direction along the front surface of the semiconductor part, the width of the first semiconductor layer being wider than a width in the direction of the second semiconductor layer.

7. The device according to claim 2, further comprising:
   a third semiconductor layer of the first conductivity type provided in the trench, the third semiconductor layer being electrically isolated from the semiconductor part by the insulating layer,
   the third semiconductor layer being provided between the first semiconductor layer and the first electrode, the third semiconductor layer being directly in contact with the first semiconductor layer,
   the first semiconductor layer having a width in a direction along the front surface of the semiconductor part, the width of the first semiconductor layer being wider than a width in the direction of the second semiconductor layer.

8. The device according to claim 7, wherein the third semiconductor layer has a width in the direction along the front surface of the semiconductor part, the width of the third semiconductor layer being same as the width of the first semiconductor layer.

9. The device according to claim 7, wherein the third semiconductor layer is provided between the first semiconductor layer and the second semiconductor layer.

10. The device according to claim 9, wherein
    the third semiconductor layer includes a first portion and a second portion, the first portion being provided between the second portion and the first semiconductor layer, the first portion having a first width in the direction along the front surface of the semiconductor part, the second portion having a second width in the direction; and the second width is narrower than the first width.

11. The device according to claim 2, wherein
    the first semiconductor layer is provided between the semiconductor part and the second semiconductor layer;
    the first semiconductor layer has a first end on a side of the first electrode and a second end on a side of the second electrode;
    the second semiconductor layer has a first end on a side of the first electrode and a second end on a side of the second electrode; and
    the second end of the first semiconductor layer and the second end of the second semiconductor layer are directly connected to the second electrode.

12. The device according to claim 2, wherein
    the semiconductor part includes a first region and a second region, the second region being provided between the first region and the second electrode, the second region including an n-type impurity with a concentration lower than a concentration of an n-type impurity in the first region, and
    the second electrode is in contact with the second region.

* * * * *